United States Patent
Guo et al.

(10) Patent No.: US 11,342,931 B2
(45) Date of Patent: May 24, 2022

(54) REFERENCE VOLTAGE CONTROLLING CIRCUIT AND ANALOG-TO-DIGITAL CONVERTER

(71) Applicant: Radiawave Technologies Co., Ltd., Shenzhen (CN)

(72) Inventors: Xiaofeng Guo, Shenzhen (CN); Erkan Alpman, Portland, OR (US); Jon Sweat Duster, Beaverton, OR (US); Ning Zhang, Shenzhen (CN); Yulin Tan, Shenzhen (CN); Haigang Feng, Shenzhen (CN)

(73) Assignee: Radiawave Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/239,626

(22) Filed: Apr. 25, 2021

(65) Prior Publication Data

US 2021/0250037 A1 Aug. 12, 2021

Related U.S. Application Data

(63) Continuation of application No. PCT/CN2019/113095, filed on Oct. 24, 2019.

(30) Foreign Application Priority Data

Nov. 23, 2018 (CN) .......................... 201811412596.0

(51) Int. Cl.
 *H03M 1/34* (2006.01)
 *H03M 1/46* (2006.01)
 (Continued)

(52) U.S. Cl.
 CPC ............. *H03M 1/34* (2013.01); *H03M 1/462* (2013.01); *H03M 1/468* (2013.01); *H03M 1/804* (2013.01); *G05F 1/575* (2013.01)

(58) Field of Classification Search
 CPC ........ H03M 1/34; H03M 1/462; H03M 1/804; H03M 1/468; G05F 1/575
 (Continued)

(56) References Cited

U.S. PATENT DOCUMENTS 8,436,677 B2 * 5/2013 Kull ....................... G11C 5/147
 327/541
9,154,151 B1 * 10/2015 Leong ................... H03M 1/182
 (Continued)

FOREIGN PATENT DOCUMENTS

CN 1783636 A 6/2006
CN 1885723 A 12/2006
 (Continued)

OTHER PUBLICATIONS

First Office Action in counterpart Chinese Patent Application No. 201811412596.0, dated Dec. 31, 2019.
 (Continued)

*Primary Examiner* — Khai M Nguyen
(74) *Attorney, Agent, or Firm* — Westbridge IP LLC

(57) ABSTRACT

A reference voltage controlling circuit and an analog-to-digital converter are disclosed. The reference voltage controlling circuit includes a reference voltage generating circuit, a plurality of groups of sampling switching units and a logic controlling circuit. The DAC capacitor array switches the sampling switching units to a second positive reference voltage and a second negative reference voltage before starting sampling or conversion, and is charged and discharged with the second positive reference voltage and the second negative reference voltage to raise a voltage to a preset voltage. The sampling switching unit is switched to a first positive reference voltage and a first negative reference voltage to charge and discharge the DAC capacitor array to a target voltage. The rising of the voltage from the preset voltage to the target voltage is completed by the first positive reference voltage and the first negative reference voltage.

18 Claims, 1 Drawing Sheet

(51) Int. Cl.
*H03M 1/80* (2006.01)
*G05F 1/575* (2006.01)

(58) Field of Classification Search
USPC .................................................. 341/158, 172
See application file for complete search history.

(56) References Cited

U.S. PATENT DOCUMENTS

2011/0032134 A1   2/2011  Cho et al.
2013/0093609 A1   4/2013  Chang et al.

FOREIGN PATENT DOCUMENTS

| CN | 104283562 A | 1/2015 |
| CN | 104734721 A | 6/2015 |
| CN | 105897272 A | 8/2016 |
| CN | 109450449 A | 3/2019 |
| KR | 20150009185 A | 1/2015 |

OTHER PUBLICATIONS

International Search Report and Written Opinion in corresponding PCT Application No. PCT/CN2019/113095, dated Jan. 8, 2020.
Second Office Action in counterpart Chinese Patent Application No. 201811412596.0, dated Jun. 24, 2020.

\* cited by examiner

REFERENCE VOLTAGE CONTROLLING CIRCUIT AND ANALOG-TO-DIGITAL CONVERTER

CROSS-REFERENCE TO RELATED APPLICATIONS

The present application is a continuation application of PCT Application No. PCT/CN2019/113095, filed on Oct. 24, 2019, which claims priority to Chinese Patent Application No. 201811412596.0, filed on Nov. 23, 2018 and entitled "Reference Voltage Controlling Circuit and Analog-to-Digital Converter". The disclosures of the aforementioned applications are hereby incorporated by reference in their entireties.

TECHNICAL FIELD

The present application relates to the technical field of semiconductor integrated circuits, in particular to a reference voltage controlling circuit and an analog-to-digital converter.

BACKGROUND

The statements herein provide only background information relevant to the present application and do not necessarily constitute prior art.

For a non-low-speed ultra-high-precision analog-to-digital converter (ADC) based on quantization of charge and discharge of a capacitor array, the reference voltage portion will occupy most of the layout area, even much larger than the core circuit portion of the ADC.

In the process of sampling and conversion of the ADC, the upper plates or the lower plates of the capacitive digital-to-analog converter (CDAC) needs to be restored to a certain voltage value, while Vrefp/Vrefn both need to charge and discharge the CDAC capacitor array to realize this process (four steps of ADC conversion: sampling, holding, quantization and coding). In the process of charging and discharging, the CDAC capacitor array continuously derives charges from Vrefp/Vrefn, which results in second harmonics of the input signals at the reference voltages which originally have only DC component. The de-coupling capacitor ("decap" for short) is equivalent to a charge storage pool to keep the stability of Vrefp/Vrefn. The function of the reference voltage driving current Idriver is to continuously charge the Vrefp terminal of the decoupling capacitor to make up for the extraction of charges so as to clamp the voltage of Vrefp/Vrefn within a stable range. The extremely large decoupling capacitor and the reference voltage driving current are commonly used by engineers when designing the reference voltages of a high-performance successive approximation analog-to-digital converter (SARADC). Usually, the effect of doubling decap is similar to that of doubling Idriver and that of halving the capacitance of the CDAC. Engineers usually weigh the capacitance of the decap, the Idriver current and the capacitance of the CDAC. In an exemplary reference voltage scheme, a 500 pF decoupling capacitor and a reference voltage corresponding to a 500 uA driving current are only sufficient to satisfy ADC performance of 66 dB Spurious Free Dynamic Range (SFDR). When 66 dB SFDR is not enough to meet the designer's requirements, it needs to further increase the decap and the Idriver. Since the system requires 16 bits of effective resolution, the SFDR is required to exceed 98 dB. For a general reference voltage scheme, driving this SAR ADC requires a 2 nF decap and a 5 mA Idriver. For a low power system, the layout area of the reference voltage portion will be large.

SUMMARY

The main purpose of this application is to provide a reference voltage controlling circuit, aiming at satisfying requirements for SFDR high performance with a smaller layout area.

In order to achieve the above purpose, the present application provides a reference voltage controlling circuit, which is configured to provide a reference voltage for a DAC capacitor array. The reference voltage controlling circuit includes a reference voltage generating circuit, a plurality of groups of sampling switching units and a logic controlling circuit; where:

output terminals of the reference voltage generating circuit is correspondingly connected with reference voltage input terminals of the DAC capacitor array through the plurality of groups of the sampling switching units, and a control terminal of the logic controlling circuit is connected with controlled terminals of the plurality of groups of sampling switching units;

the reference voltage generating circuit includes a first voltage output terminal configured to output a first positive reference voltage, a second voltage output terminal configured to output a first negative reference voltage, a third voltage output terminal configured to output a second positive reference voltage and a fourth voltage output terminal configured to output a second negative reference voltage, each of the first voltage output terminal, the second voltage output terminal, the third voltage output terminal, and the fourth voltage output terminal of the reference voltage generating circuit is correspondingly connected with one terminal of each sampling capacitor of the DAC capacitor array through each group of the sampling switching units, and another terminal of each sampling capacitor is connected with an output terminal of an analog input signal; and the logic controlling circuit is configured to control the plurality of groups of the sampling switching units to be switched to connect to the third voltage output terminal and the fourth voltage output terminal of the reference voltage generating circuit, to charge and discharge the DAC capacitor array by the second positive reference voltage and the second negative reference voltage, and control the plurality of groups of the sampling switching units to be connected to the first voltage output terminal and the second voltage output terminal of the reference voltage generating circuit when a voltage of the DAC capacitor array rises to a preset voltage, to continue to charge and discharge the DAC capacitor array through the first positive reference voltage and the first negative reference voltage until the voltage of the DAC capacitor array rises to a target voltage.

Optionally, a ratio of the target voltage to the preset voltage is 100:95.

Optionally, a time duration for the voltage of the DAC capacitor array to rise to the preset voltage is greater than or equal to 500 ps and less than or equal to 2 ns.

Optionally, the reference voltage generating circuit includes a voltage level output circuit, a first driving current source, a second driving current source, a first switching circuit, a second switching circuit, a first decoupling capacitor, a second decoupling capacitor, a first resistor, and a second resistor;

a controlled terminal of the first switching circuit and a controlled terminal of the second switching circuit are both connected with a signal output terminal of the voltage level output circuit, a current output terminal of the first driving current source is connected with an input terminal of the first switching circuit, an output terminal of the first switching circuit, a first terminal of the first resistor and a first terminal of the first decoupling capacitor are interconnected to form a connection node which is the first voltage output terminal of the reference voltage generating circuit, a second terminal of the first resistor and a second terminal of the first decoupling capacitor are both grounded to form a connection node which is the second voltage output terminal of the reference voltage generating circuit, a current output terminal of the second driving current source is connected to an input terminal of the second switching circuit, an output terminal of the second switching circuit, a first terminal of the second resistor and a first terminal of the second decoupling capacitor are interconnected to form a connection node which is the third voltage output terminal of the reference voltage generating circuit, a second terminal of the second resistor and a second terminal of the second decoupling capacitor are both grounded to form a connection node which is a fourth voltage output terminal of the reference voltage generating circuit.

Optionally, the voltage level output circuit includes a first voltage source, a third current source, a comparator, a third switching circuit, a third resistor, a fourth resistor, and a first capacitor;

a power output terminal of the first voltage source, a first terminal of the first capacitor, a first terminal of the third resistor and a non-inverting input terminal of the comparator are interconnected, a second terminal of the first capacitor and a second terminal of the third resistor are both grounded, a current output terminal of the third current source is connected with an input terminal of the third switching circuit, an output terminal of the third switching circuit, an inverting input terminal of the comparator and a first terminal of the fourth resistor are interconnected, a second terminal of the fourth resistor is grounded, an output terminal of the comparator is connected with a controlled terminal of the third switching circuit to form a connection node which is a signal output terminal of the voltage level output circuit.

Optionally, the first switching circuit, the second switching circuit and the third switching circuit are NMOS transistors.

Optionally, the reference voltage generating circuit further includes a fifth resistor and a sixth resistor;

a first terminal of the fifth resistor and a first terminal of the sixth resistor are both connected to the signal output terminal of the voltage level output circuit, a second terminal of the fifth resistor is connected to the controlled terminal of the first switching circuit, and a second terminal of the sixth resistor is connected to the controlled terminal of the second switching circuit.

Optionally, each group of the sampling switching units is correspondingly connected with capacitors in the DAC capacitor array, each group of the sampling switching units includes four sampling switching units, and each group of the sampling switching units is respectively connected with the first voltage output terminal, the second voltage output terminal, the third voltage output terminal and the fourth voltage output terminal of the reference voltage generating circuit.

Optionally, the second terminal of the first resistor is connected to a first ground wire and the second terminal of the second resistor is connected to a second ground wire.

The present application also provides an analog-to-digital converter including a DAC capacitor array and a reference voltage controlling circuit configured to provide reference voltages to that DAC capacitor array, the reference voltage controlling circuit including a reference voltage generating circuit, a plurality of groups of sampling switching units and a logic controlling circuit; where:

output terminals of the reference voltage generating circuit is correspondingly connected with reference voltage input terminals of the DAC capacitor array through the plurality of groups of the sampling switching units, and a control terminal of the logic controlling circuit is connected with controlled terminals of the plurality of groups of sampling switching units;

the reference voltage generating circuit includes a first voltage output terminal configured to output a first positive reference voltage, a second voltage output terminal configured to output a first negative reference voltage, a third voltage output terminal configured to output a second positive reference voltage and a fourth voltage output terminal configured to output a second negative reference voltage, each of the first voltage output terminal, the second voltage output terminal, the third voltage output terminal, and the fourth voltage output terminal of the reference voltage generating circuit is correspondingly connected with one terminal of each sampling capacitor of the DAC capacitor array through each group of the sampling switching units, and another terminal of each sampling capacitor is connected with an output terminal of an analog input signal; and the logic controlling circuit is configured to control the plurality of groups of the sampling switching units to be switched to connect to the third voltage output terminal and the fourth voltage output terminal of the reference voltage generating circuit, to charge and discharge the DAC capacitor array by the second positive reference voltage and the second negative reference voltage, and control the plurality of groups of the sampling switching units to be connected to the first voltage output terminal and the second voltage output terminal of the reference voltage generating circuit when a voltage of the DAC capacitor array rises to a preset voltage, to continue to charge and discharge the DAC capacitor array through the first positive reference voltage and the first negative reference voltage until the voltage of the DAC capacitor array rises to a target voltage.

Optionally, a ratio of the target voltage to the preset voltage is 100:95.

Optionally, a time duration for the voltage of the DAC capacitor array to rise to the preset voltage is greater than or equal to 500 ps and less than or equal to 2 ns.

Optionally, the reference voltage generating circuit includes a voltage level output circuit, a first driving current source, a second driving current source, a first switching circuit, a second switching circuit, a first decoupling capacitor, a second decoupling capacitor, a first resistor, and a second resistor;

a controlled terminal of the first switching circuit and a controlled terminal of the second switching circuit are both connected with a signal output terminal of the voltage level output circuit, a current output terminal of the first driving current source is connected with an input terminal of the first switching circuit, an output terminal of the first switching circuit, a first terminal of the first resistor and a first terminal of the first decoupling capacitor are interconnected to form a connection node which is the first voltage output terminal of the reference voltage generating circuit, a second terminal of the first resistor and a second terminal of the first decoupling capacitor are both grounded to form a connection node which is the second voltage output terminal of the reference voltage generating circuit, a current output terminal of the second driving current source is connected to an input terminal of the second switching circuit, an output terminal of the second switching circuit, a first terminal of the second resistor and a first terminal of the second decoupling capacitor are interconnected to form a connection node which is the third voltage output terminal of the reference voltage generating circuit, a second terminal of the second resistor and a second terminal of the second decoupling capacitor are both grounded to form a connection node which is a fourth voltage output terminal of the reference voltage generating circuit.

Optionally, the voltage level output circuit includes a first voltage source, a third current source, a comparator, a third switching circuit, a third resistor, a fourth resistor, and a first capacitor;

a power output terminal of the first voltage source, a first terminal of the first capacitor, a first terminal of the third resistor and a non-inverting input terminal of the comparator are interconnected, a second terminal of the first capacitor and a second terminal of the third resistor are both grounded, a current output terminal of the third current source is connected with an input terminal of the third switching circuit, an output terminal of the third switching circuit, an inverting input terminal of the comparator and a first terminal of the fourth resistor are interconnected, a second terminal of the fourth resistor is grounded, an output terminal of the comparator is connected with a controlled terminal of the third switching circuit to form a connection node which is a signal output terminal of the voltage level output circuit.

Optionally, the first switching circuit, the second switching circuit and the third switching circuit are NMOS transistors.

Optionally, the reference voltage generating circuit further includes a fifth resistor and a sixth resistor;

a first terminal of the fifth resistor and a first terminal of the sixth resistor are both connected to the signal output terminal of the voltage level output circuit, a second terminal of the fifth resistor is connected to the controlled terminal of the first switching circuit, and a second terminal of the sixth resistor is connected to the controlled terminal of the second switching circuit.

Optionally, each group of the sampling switching units is correspondingly connected with capacitors in the DAC capacitor array, each group of the sampling switching units includes four sampling switching units, and each group of the sampling switching units is respectively connected with the first voltage output terminal, the second voltage output terminal, the third voltage output terminal and the fourth voltage output terminal of the reference voltage generating circuit.

Optionally, the second terminal of the first resistor is connected to a first ground wire and the second terminal of the second resistor is connected to a second ground wire.

In the present technology scheme, a reference voltage controlling circuit is formed by a reference voltage generating circuit, a plurality of groups of sampling switching units and a logic controlling circuit. The reference voltage controlling circuit is configured to provide reference voltages for a DAC capacitor array. The reference voltage generating circuit includes voltage output terminals that output a first positive reference voltage, a first negative reference voltage, a second positive reference voltage, and a second negative reference voltage, respectively. The sampling switching units are switched to the second positive reference voltage and the second negative reference voltage before the DAC capacitor array starting sampling or conversion. The second positive reference voltage and the second negative reference voltage start charging and discharging the DAC capacitor array, and increase a voltage of the DAC capacitor array to a preset voltage. Then the sampling switching units are switched to the first positive reference voltage and the first negative reference voltage, and the DAC capacitor array is charged and discharged to a target voltage by the first positive reference voltage and the first negative reference voltage. According to the present application, the establishing of the target voltage by upper plates or lower plates of the capacitor array during sampling or conversion is divided into two phases for charging and discharging. A phase between the preset voltage and the target voltage is completed by the first positive reference voltage and the first negative reference voltage, which remain stable and accurate with less charge injection and extraction, and determine the accuracy of CDAC switching. It is equivalent to lead out a branch for outputting the second positive reference voltage and the second negative reference voltage from the reference voltage generating circuit originally set to output the first positive reference voltage and the first negative reference voltage. And it is no need to change a decoupling capacitance and a driving current source of the original reference voltage generating circuit, thereby realizing SFDR high performance and solving the problems exited in layout area and power consumption.

BRIEF DESCRIPTION OF THE DRAWINGS

In order to more clearly explain the embodiments of the present application or the technical solutions in the related art, the drawings used in the description of the embodiments or the related art will be briefly introduced below. Obviously, the drawings in the following description are merely some embodiments of the present application. For those of ordinary skill in the art, other drawings can be obtained based on the structure shown in these drawings without creative work.

The realization of the purposes, functional features and advantages of the present application will be further explained with reference to the accompanying drawings in combination with the embodiments.

DETAILED DESCRIPTION OF THE EMBODIMENTS

In the following, the technical solutions in the embodiments of the present application will be clearly and completely described with reference to the drawings in the embodiments of the present application. Obviously, the described embodiments are only a part of the embodiments of this application, and not all of the embodiments. Based on the embodiments of the present application, all other embodiments obtained by those of ordinary skilled in the art without creative efforts shall fall within the claimed scope of this application.

It should be noted that the descriptions related to "first", "second", and the like in this application are for descriptive purposes only, and cannot be understood as indicating or implying their relative importance or implicitly indicating the number of technical features indicated. Therefore, features associated with "first" and "second" may explicitly or implicitly include at least one of such feature. In addition, the meaning of "and/or" in the full text is to include three scenarios. Taking "A and/or B" as an example, it includes A technical solution, B technical solution, and technical solutions that A and B are both met. In addition, the technical solutions of the various embodiments can be combined with each other, but they must be based on what can be achieved by those of ordinary skill in the art. When the combination of technical solutions is contradictory or cannot be achieved, it should be considered that such a combination of technical solutions does not exist, or is not within the scope of protection defined by the claims of this application.

The present application provides a reference voltage controlling circuit 1000 configured to provide a reference voltage for a DAC capacitor array.

Figure 1:
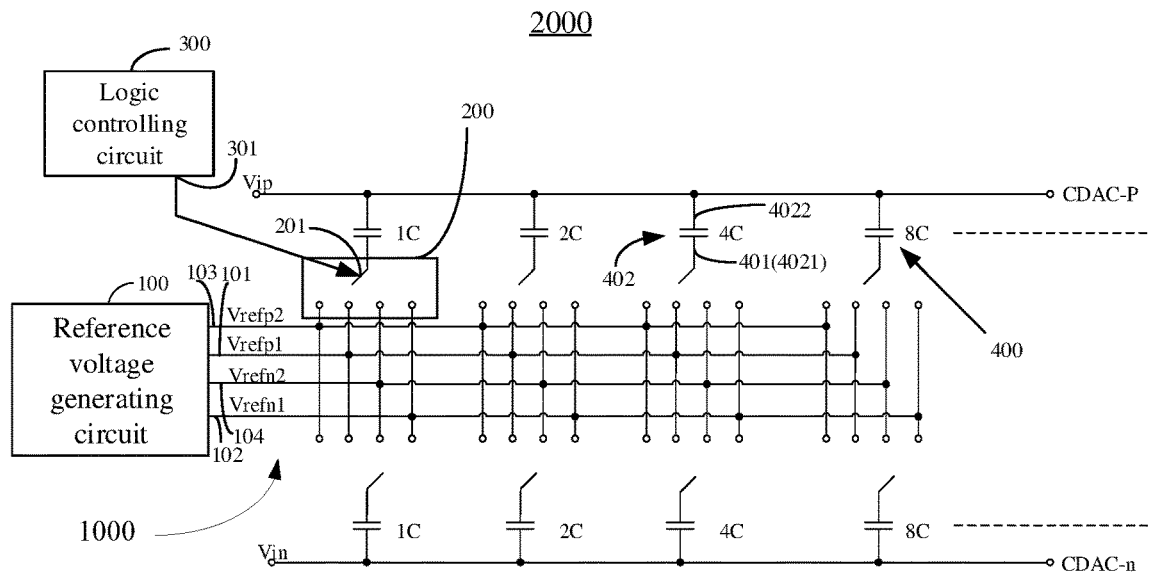
FIG. 1 is a schematic structural diagram of a reference voltage controlling circuit according to an embodiment of the present application.

As shown in FIG. 1, FIG. 1 is a schematic structural diagram of a reference voltage controlling circuit of an embodiment of the present application. In this embodiment, the reference voltage controlling circuit 1000 includes a reference voltage generating circuit 100, a plurality of groups of sampling switching units 200, and a logic controlling circuit 300. Output terminals of the reference voltage generating circuit 100 are correspondingly connected with reference voltage input terminals 401 of the DAC capacitor array 400 through the plurality of groups of sampling switching units 200, and a controlling terminal 301 of the logic controlling circuit 300 is connected with controlled terminals 201 of the plurality of groups of sampling switching units 200.

The reference voltage generating circuit 100 includes a first voltage output terminal 101 configured to output a first positive reference voltage Vrefp1, a second voltage output terminal 102 configured to output a first negative reference voltage Vrefn1, a third voltage output terminal 103 configured to output a second positive reference voltage Vrefp2, and a fourth voltage output terminal 104 configured to output a second negative reference voltage Vrefn2. The four voltage output terminals of the reference voltage generating circuit 100 are correspondingly connected with one terminal 4021 of each sampling capacitor 402 of the DAC capacitor array 400 through each group of the sampling switching units 200, and the other terminal 4022 of each sampling capacitor 402 is connected with an output terminal of an analog input signal.

The logic controlling circuit is configured to control the plurality of groups of sampling switching units 200 to be switched to connect to the third voltage output terminal 103 and the fourth voltage output terminal 104 of the reference voltage generating circuit 100, to charge and discharge the DAC capacitor array 400 through the second positive reference voltage Vrefp2 and the second negative reference voltage Vrefn2. When a voltage of the DAC capacitor array 400 rises to a preset voltage, the plurality of groups of sampling switching units 200 are controlled to be switched to connect to the first voltage output terminal 101 and the second voltage output terminal 102 of the reference voltage generating circuit 100, to continue to charge and discharge the DAC capacitor array 400 through the first positive reference voltage Vrefp1 and the first negative reference voltage Vrefn1 until the voltage of the DAC capacitor array rises to a target voltage.

In this embodiment, the DAC capacitor array 400 includes a first sub-DAC capacitor array and a second sub-DAC capacitor array of a differential structure. The DAC capacitor array 400 may be upper plate sampling or lower plate sampling. As in the upper plate sampling, analog differential signals Vip and Vin are respectively input to upper plates of the DAC capacitor array 400, and differential signals Vop and Von are output to a comparator of an analog-to-digital converter. Lower plates of the DAC capacitor array 400 are connected to voltage output terminals of reference voltage through sampling switches. Similarly, when the DAC capacitor array is in the lower plate sampling, the upper and lower plates of the DAC capacitor array 400 are connected in a way opposite to the connection way in the upper plate sampling. In this embodiment, the upper plate sampling is specifically introduced as an example.

The logic controlling circuit 300 includes a logic controller and a clock generator. The logic controller controls the sampling of the DAC capacitor array 400 and the switching of the sampling switches according to a clock signal of the clock generator.

It should be noted that values of the first positive reference voltage Vrefp1 and the second positive reference voltage Vrefp2 can be set according to actual needs, and there is no specific limitation here.

The reference voltage generating circuit 100 includes two voltage output branches. Each voltage output branch includes two voltage output terminals, and the two voltage output branches are set to output two sets of differential reference voltages Vrefp1, Vrefn1 and Vrefp2, Vrefn2. The voltage output branches include driving current sources and decoupling capacitors. Each voltage output branch is charged and discharged respectively during the establishment of a voltage of the upper plates of the DAC capacitor array 400 to the target voltage. In this embodiment, a partial voltage of the target voltage to be established by the upper plates of the DAC capacitor array 400 is set to be the preset voltage. During the sampling or conversion of the DAC capacitor array 400, a phase in which the voltage of the DAC capacitor array 400 is raised to the preset voltage is set as a driving phase of reference voltage, a phase of being charged and rising the voltage from the preset voltage to the target voltage is set as an establishing phase of reference voltage, and the target voltage is close to the preset voltage. The first positive reference voltage Vrefp1 and the first negative reference voltage Vrefn1 charge and discharge the DAC capacitor array 400 during the establishing phase of reference voltage. The second positive reference voltage Vrefp2 and the second negative reference voltage Vrefn2 charge and discharge the DAC capacitor array 400 during the driving phase of reference voltage. The first positive reference voltage Vrefp1 and the first negative reference voltage Vrefn1 only inject and extract a small amount of charges to the DAC capacitor array 400. The first positive reference voltage Vrefp1 and the first negative reference voltage Vrefn1 remain stable and accurate. Therefore, harmonics on the first positive reference voltage Vrefp1 and the first negative reference voltage Vrefn1 are reduced in this process, realizing a high performance in SFDR. At the same time, since the accuracy of the voltage of the upper plates during comparing determines the conversion accuracy of the DAC capacitor array 400, the conversion accuracy of the DAC capacitor array 400 also maintains high accuracy.

The second positive reference voltage Vrefp2 and the second negative reference voltage Vrefn2 serve in the driving phase of reference voltages, as main sources of charge extraction and injection during switching of the DAC capacitor array 400, charge extraction and injection are very large in the driving phase. The second positive reference voltage Vrefp2 and the second negative reference voltage Vrefn2 are affected by sampling and conversion like the general reference voltage, resulting in second harmonic and jitter of signals.

The operation process of the reference voltage controlling circuit 1000 is as follows.

Before sampling or conversion of the DAC capacitor array 400 (about 100 ps in advance), the logic controlling circuit 300 switches the sampling switching units 200 originally connected to Vrefp1 to Vrefp2, and switches the sampling switching units 200 originally connected to Vrefn1 to Vrefn2, preparing to buffer the upcoming charge extraction or injection required by sampling or conversion. The logic controlling circuit 300 then controls the DAC capacitor array 400 to start sampling or switching (the switching mode of the DAC capacitor array is: from Vrefp1 to Vrefn1, or from Vrefn1 to Vrefp1, or from Vin to Vrefp1/Vrefn1), and lasts for a preset period of time, so that the upper plates of the DAC capacitor array 400 re-establishes the preset voltage. At this time, the DAC capacitor array 400 is driven by Vrefp2/Vrefn2. As the voltage across the capacitors 402 is exponentially related to the establishing time, in the driving phase of the reference voltage, the preset voltage can be established for a preset time duration. The preset time duration can be obtained by testing and calculating. The logic controlling circuit 300 then switches the sampling switching units 200 already connected to Vrefp2 back to Vrefp1, and switches the sampling switching units 200 already connected to Vrefn2 back to Vrefn1, and the establishing phase of reference voltage is completed by the establishing level Vrefp1, Vrefn1, thus raising the voltage of the upper plates of the DAC capacitor array 400 to the target voltage. In the remaining time, the sampling switching units 200 on the DAC capacitor array 400 are connected to Vrefp1/Vrefn1 to maintain the ultra-high precision of the target voltage of the upper plates until the arrival of the next sampling or conversion.

In the present technology scheme, a reference voltage controlling circuit 1000 is formed by a reference voltage generating circuit 100, a plurality of groups of sampling switching units 200 and a logic controlling circuit 300. The reference voltage controlling circuit 1000 is configured to provide reference voltages for a DAC capacitor array 400. The reference voltage generating circuit 100 includes voltage output terminals that output a first positive reference voltage Vrefp1, a first negative reference voltage Vrefn1, a second positive reference voltage Vrefp2, and a second negative reference voltage Vrefn2, respectively. The sampling switching units 200 are switched to the second positive reference voltage Vrefp2 and the second negative reference voltage Vrefn2 before the DAC capacitor array 400 starts sampling or conversion. The second positive reference voltage Vrefp2 and the second negative reference voltage Vrefn2 start charging and discharging the DAC capacitor array 400, and increase a voltage of the DAC capacitor array 400 to a preset voltage. Then the sampling switching units 200 are switched to the first positive reference voltage Vrefp1 and the first negative reference voltage Vrefn1, and the DAC capacitor array 400 is charged and discharged to a target voltage by the first positive reference voltage Vrefp1 and the first negative reference voltage Vrefn1. According to the present application, the establishing of the target voltage by upper plates or lower plates of the capacitor array during sampling or conversion is divided into two phases for charging and discharging. A phase between the preset voltage and the target voltage is completed by the first positive reference voltage Vrefp1 and the first negative reference voltage Vrefn1, which remain stable and accurate with less charge injection and extraction, and determine the accuracy of CDAC switching. It is equivalent to lead out a branch for outputting the second positive reference voltage Vrefp2 and the second negative reference voltage Vrefn2 from the reference voltage generating circuit 100 originally set to output the first positive reference voltage Vrefp1 and the first negative reference voltage Vrefn1. And it is no need to change a decoupling capacitor and a driving current source of the original reference voltage generating circuit 100, thereby realizing SFDR high performance and solving the problems exited in layout area and power consumption.

In an alternative embodiment, a ratio of the target voltage to the preset voltage is 100:95.

In this embodiment, a rising phase in which a voltage of the upper plates rises from 0 to 95% of the target voltage is set as the driving phase of reference voltage, and a rising phase in which the voltage of the upper plates rises from 95% to 99.99% of the target voltage is set as the establishing stage of reference voltage. The closer the reference voltage is to the target voltage, the smaller the harmonics of the first positive reference voltage Vrefp1 and the first negative reference voltage Vrefn1 will be. Considering the rising speed of the voltage, the conversion time and the size of the harmonics, in this embodiment, the ratio of the reference voltage to the target voltage is set to 95%. If the preset voltage is set to be too large, the harmonics of the first positive reference voltage Vrefp1 and the first negative reference voltage Vrefn1 become smaller, but the switching time is insufficient, and inadequate switching is prone to occur. If the preset voltage is set to be too small, the harmonics of the first positive reference voltage Vrefp1 and the first negative reference voltage Vrefn1 become larger.

Further, a time for the voltage of the DAC capacitor array to rise to the preset voltage is greater than or equal to 500 ps and less than or equal to 2 ns.

It should be noted that, for the voltage across the DAC capacitor array is exponential to a charge and discharge time, the logic controlling circuit 300 can correspondingly set switching interval times for DAC capacitor arrays with different capacitance values. For a high-precision DAC capacitor array, a time duration of the driving phase is affected by the process and specific design. In this embodiment, time durations of driving phases of reference voltages are set to be fall in 500 ps to 2 ns according to different DAC capacitor arrays, and the driving phases with the voltage from 0 to 95% is sufficiently completed within 500 ps to 2 ns.

Figure 2:
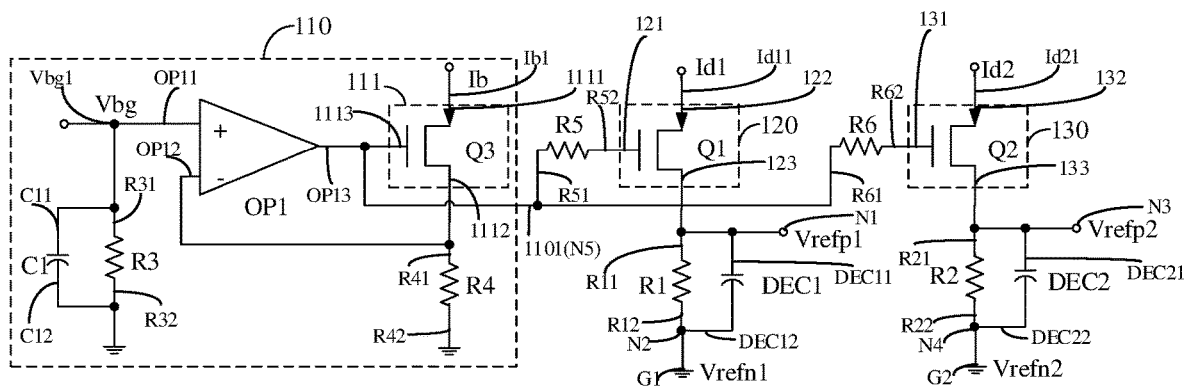
FIG. 2 is a schematic diagram of a circuit structure of a reference voltage generating circuit of the reference voltage controlling circuit according to an embodiment of the present application.

As shown in FIG. 2, FIG. 2 is a schematic diagram of a circuit structure of the reference voltage generating circuit according to an embodiment of the reference voltage controlling circuit of the present application. In this embodiment, the reference voltage generating circuit 100 includes a voltage level output circuit 110, a first driving current source Id1, a second driving current source Id2, a first switching circuit 120, a second switching circuit 130, a first decoupling capacitor DEC1, a second decoupling capacitor DEC2, a first resistor R1, and a second resistor R2.

A controlled terminal 121 of the first switching circuit 120 and a controlled terminal 131 of the second switching circuit 130 are both connected to a signal output terminal 1101 of the voltage level output circuit 110. A current output terminal Id11 of the first driving current source Id1 is connected to an input terminal 122 of the first switching circuit 120. An output terminal 123 of the first switching circuit 120, a first terminal R11 of the first resistor R1 and a first terminal DEC11 of the first decoupling capacitor DEC1 are interconnected to form a connection node N1. The connection node N1 is the first voltage output terminal 101 of the reference voltage generating circuit 100. A second terminal R12 of the first resistor R1 and a second terminal DEC12 of the first decoupling capacitor DEC1 are both grounded to form a connection node N2 which is the second voltage output terminal 102 of the reference voltage generating circuit 100. A current output terminal Id21 of the second driving current source Id2 is connected to an input terminal 132 of the second switching circuit 130. An output terminal 133 of the second switching circuit 130, a first terminal R21 of the second resistor R2 and a first terminal DEC21 of the second decoupling capacitor DEC2 are interconnected to form a connection node N3 which is the third voltage output terminal 103 of the reference voltage generating circuit 100. A second terminal R22 of the second resistor R2 and a second terminal DEC22 of the second decoupling capacitor DEC2 are both grounded to form a connection node N4 which is the fourth voltage output terminal 104 of the reference voltage generating circuit 100.

In this embodiment, the voltage level output circuit 110 is configured to continuously output control signals to switch on the first switching circuit 120 and the second switching circuit 130, the first driving current source Id1 charges the first decoupling capacitor DEC1 through the first switching circuit 120, and the second driving current source Id2 charges the second decoupling capacitor DEC2 through the second switching circuit 130. In this example, the first negative reference voltage Vrefn1 and the second negative reference voltage Vrefn2 are supplied from ground wires.

The first switching circuit 120 and the second switching circuit 130 may adopt switching devices with on-off capability, such as MOS transistors, triodes, etc., and may be specifically designed according to actual requirements.

The capacitance values of the first decoupling capacitor DEC1 and the second decoupling capacitor DEC2 can be selected according to actual requirements, and the capacitance values of the first decoupling capacitor DEC1 and the second decoupling capacitor DEC2 can be equal or different, and specifically be selected according to the capacitance value of the DAC capacitor array 400 and the driving current sources.

Similarly, the first driving current source Id1 and the second driving current source Id2 can also be selected according to actual requirements. The current values of the first driving current source Id1 and the second driving current source Id2 can be equal or different, and can be specifically selected according to the capacitance value and decoupling capacitance of the DAC capacitor array 400.

In an alternative embodiment, the voltage level output circuit 110 includes a first voltage source Vbg, a third current source Ib, a comparator OP1, a third switching circuit 111, a third resistor R3, a fourth resistor R4, and a first capacitor C1.

A power output terminal Vbg1 of the first voltage source Vbg, a first terminal C1 of the first capacitor C1, a first terminal R31 of the third resistor R3 and a non-inverting input terminal OP11 of the comparator OP1 are interconnected. A second terminal C12 of the first capacitor C1 and a second terminal R32 of the third resistor R3 are both grounded. A current output terminal Ib1 of the third current source Ib is connected to an input terminal 1111 of the third switching circuit 111. An output terminal 1112 of the third switching circuit 111, an inverting input terminal OP12 of the comparator OP1 and a first terminal R41 of the fourth resistor R4 are interconnected, and a second terminal R42 of the fourth resistor R4 is grounded. An output terminal OP13 of the comparator OP1 is connected to a controlled terminal 1113 of the third switching circuit 111 to form a connection node N5 which is the signal output terminal 1101 of the voltage level output circuit 110.

In this embodiment, the first voltage source Vbg is configured to provide a bandgap reference voltage. The first capacitor C1 is configured for filtering. The first voltage source Vbg is compared with the inverting input terminal OP12 of the comparator OP1 via the non-inverting input terminal OP11 of the comparator OP1, thereby continuously outputting voltage level signals to the first switching circuit 120 and the second switching circuit 130, to ensure that the driving current source continuously charges the decoupling capacitors to compensate for the extracted charges.

In an alternative embodiment, the first switching circuit 120, the second switching circuit 130 and the third switching circuit 111 are all NMOS transistors.

In this embodiment, the NMOS transistors receive a high-level voltage from the comparator OP1 and turn on, and the first current source, the second current source and the third current source Ib all output currents to the decoupling capacitors or the ground through the corresponding switching circuits.

In an alternative embodiment, the reference voltage generating circuit 100 further includes a fifth resistor R5 and a sixth resistor R6.

A first terminal R51 of the fifth resistor R5 and a first terminal R61 of the sixth resistor R6 are connected to the signal output terminal 1101 of the voltage level output circuit 110, a second terminal R52 of the fifth resistor R5 is connected to the controlled terminal 121 of the first switching circuit 120, and a second terminal R62 of the sixth resistor R6 is connected to the controlled terminal 131 of the second switching circuit 130.

In this embodiment, the fifth resistor R5 and the sixth resistor R6 play a step-down role to prevent the switching circuits from being damaged due to excessive voltages of the control signals output by the voltage level output circuit 110.

In an alternative embodiment, each group of the sampling switching units 200 is correspondingly connected with capacitors in the DAC capacitor array 400. Each group of the sampling switching units 200 includes four sampling switching units 200, and each group of the sampling switching units 200 is respectively connected to the first voltage output terminal 101, the second voltage output terminal 102, the third voltage output terminal 103 and the fourth voltage output terminal 104 of the reference voltage generating circuit 100.

It should be noted that, the sampling switching units 200 are multiple, and are divided into a number of groups corresponding to capacitors 402 of the DAC capacitor array 400 one by one. When the DAC capacitor array 400 is provided with a total of 2N capacitors 402, the sampling switching units 200 have 2N groups, and each group includes four sampling switching units 200, which are respectively connected to the four voltage output terminals of the reference voltage generating circuit 100, and are correspondingly turned on or off under the control of the logic controlling circuit 300 before and after the sampling or conversion of the DAC capacitor array 400, thereby completing the sampling or conversion of the DAC capacitor array 400 and the switching of the four reference voltages.

It should be noted that only one of the sampling switching units 200 connected to the reference voltages is turned on (a floating state is allowed in a short time), while the other terminal of the sampling switching unit 200 is connected to Vin only during sampling and remains in a high resistance state after sampling.

In an alternative embodiment, the ground terminal of the first resistor R1 is connected to a first ground wire G1, and the ground terminal of the second resistor R2 is connected to a second ground wire G2.

It should be noted that in order to avoid signal interference between the first negative reference voltage Vrefn1 and the second negative reference voltage Vrefn2, which causes harmonic generation of the first positive reference voltage Vrefp1 and the first negative reference voltage Vrefn1, the first resistor R1 and the second resistor R2 are respectively connected to different ground wires.

the present application also provides an analog-to-digital converter 2000. The analog-to-digital converter 2000 includes a DAC capacitor array 400 and a reference voltage controlling circuit 1000 as described above. The specific structure of the reference voltage controlling circuit 1000 can make reference to the above-mentioned embodiments. Since the analog-to-digital converter 2000 adopts all the technical solutions of all the above-mentioned embodiments, it has at least all the technical effects brought by the technical solutions of the above-mentioned embodiments, and will not be repeated here.

The above are only optional embodiments of the present application, and are not intend to limit the scope of the present application. All equivalent structural changes made within the concept of the present application by using the contents of the specification and drawings of the present application, or direct/indirect application in other related technical fields are included in the claim scope of the present application.

What is claimed is:

1. A reference voltage controlling circuit configured to provide reference voltages for a DAC capacitor array, comprising a reference voltage generating circuit, a plurality of groups of sampling switching units and a logic controlling circuit; wherein:

output terminals of the reference voltage generating circuit is correspondingly connected with reference voltage input terminals of the DAC capacitor array through the plurality of groups of the sampling switching units, and a controlling terminal of the logic controlling circuit is connected with controlled terminals of the plurality of groups of sampling switching units;

the reference voltage generating circuit comprises a first voltage output terminal configured to output a first positive reference voltage, a second voltage output terminal configured to output a first negative reference voltage, a third voltage output terminal configured to output a second positive reference voltage and a fourth voltage output terminal configured to output a second negative reference voltage, each of the first voltage output terminal, the second voltage output terminal, the third voltage output terminal, and the fourth voltage output terminal of the reference voltage generating circuit is correspondingly connected with one terminal of each sampling capacitor of the DAC capacitor array through each group of the sampling switching units, and another terminal of each sampling capacitor is connected with an output terminal of an analog input signal; and the logic controlling circuit is configured to control the plurality of groups of the sampling switching units to be switched to connect to the third voltage output terminal and the fourth voltage output terminal of the reference voltage generating circuit, to charge and discharge the DAC capacitor array by the second positive reference voltage and the second negative reference voltage, and control the plurality of groups of the sampling switching units to be connected to the first voltage output terminal and the second voltage output terminal of the reference voltage generating circuit when a voltage of the DAC capacitor array rises to a preset voltage, to continue to charge and discharge the DAC capacitor array through the first positive reference voltage and the first negative reference voltage until the voltage of the DAC capacitor array rises to a target voltage.

2. The reference voltage controlling circuit of claim 1, wherein a ratio of the target voltage to the preset voltage is 100:95.

3. The reference voltage controlling circuit of claim 2, wherein a time duration for the voltage of the DAC capacitor array to rise to the preset voltage is greater than or equal to 500 ps and less than or equal to 2 ns.

4. The reference voltage controlling circuit of claim 1, wherein the reference voltage generating circuit comprises a voltage level output circuit, a first driving current source, a second driving current source, a first switching circuit, a second switching circuit, a first decoupling capacitor, a second decoupling capacitor, a first resistor, and a second resistor;

a controlled terminal of the first switching circuit and a controlled terminal of the second switching circuit are both connected with a signal output terminal of the voltage level output circuit, a current output terminal of the first driving current source is connected with an input terminal of the first switching circuit, an output terminal of the first switching circuit, a first terminal of the first resistor and a first terminal of the first decoupling capacitor are interconnected to form a connection node which is the first voltage output terminal of the reference voltage generating circuit, a second terminal of the first resistor and a second terminal of the first decoupling capacitor are both grounded to form a connection node which is the second voltage output terminal of the reference voltage generating circuit, a current output terminal of the second driving current source is connected to an input terminal of the second switching circuit, an output terminal of the second switching circuit, a first terminal of the second resistor and a first terminal of the second decoupling capacitor are interconnected to form a connection node which is the third voltage output terminal of the reference voltage generating circuit, a second terminal of the second resistor and a second terminal of the second decoupling capacitor are both grounded to form a connection node which is a fourth voltage output terminal of the reference voltage generating circuit.

5. The reference voltage controlling circuit of claim 4, wherein the voltage level output circuit comprises a first voltage source, a third current source, a comparator, a third switching circuit, a third resistor, a fourth resistor, and a first capacitor;
a power output terminal of the first voltage source, a first terminal of the first capacitor, a first terminal of the third resistor and a non-inverting input terminal of the comparator are interconnected, a second terminal of the first capacitor and a second terminal of the third resistor are both grounded, a current output terminal of the third current source is connected with an input terminal of the third switching circuit, an output terminal of the third switching circuit, an inverting input terminal of the comparator and a first terminal of the fourth resistor are interconnected, a second terminal of the fourth resistor is grounded, an output terminal of the comparator is connected with a controlled terminal of the third switching circuit to form a connection node which is a signal output terminal of the voltage level output circuit.

6. The reference voltage controlling circuit of claim 5, wherein the first switching circuit, the second switching circuit and the third switching circuit are NMOS transistors.

7. The reference voltage controlling circuit of claim 6, wherein the reference voltage generating circuit further comprises a fifth resistor and a sixth resistor;
a first terminal of the fifth resistor and a first terminal of the sixth resistor are both connected to the signal output terminal of the voltage level output circuit, a second terminal of the fifth resistor is connected to the controlled terminal of the first switching circuit, and a second terminal of the sixth resistor is connected to the controlled terminal of the second switching circuit.

8. The reference voltage controlling circuit of claim 7, wherein each group of the sampling switching units is correspondingly connected with capacitors in the DAC capacitor array, each group of the sampling switching units comprises four sampling switching units, and each group of the sampling switching units is respectively connected with the first voltage output terminal, the second voltage output terminal, the third voltage output terminal and the fourth voltage output terminal of the reference voltage generating circuit.

9. The reference voltage controlling circuit of claim 4, wherein the second terminal of the first resistor is connected to a first ground wire and the second terminal of the second resistor is connected to a second ground wire.

10. An analog-to-digital converter comprising a DAC capacitor array and a reference voltage controlling circuit configured to provide reference voltages to the DAC capacitor array, the reference voltage controlling circuit comprising a reference voltage generating circuit, a plurality of groups of sampling switching units and a logic controlling circuit; wherein:
output terminals of the reference voltage generating circuit is correspondingly connected with reference voltage input terminals of the DAC capacitor array through the plurality of groups of the sampling switching units, and a control terminal of the logic controlling circuit is connected with controlled terminals of the plurality of groups of sampling switching units;
the reference voltage generating circuit comprises a first voltage output terminal configured to output a first positive reference voltage, a second voltage output terminal configured to output a first negative reference voltage, a third voltage output terminal configured to output a second positive reference voltage and a fourth voltage output terminal configured to output a second negative reference voltage, each of the first voltage output terminal, the second voltage output terminal, the third voltage output terminal, and the fourth voltage output terminal of the reference voltage generating circuit is correspondingly connected with one terminal of each sampling capacitor of the DAC capacitor array through each group of the sampling switching units, and another terminal of each sampling capacitor is connected with an output terminal of an analog input signal; and
the logic controlling circuit is configured to control the plurality of groups of the sampling switching units to be switched to connect to the third voltage output terminal and the fourth voltage output terminal of the reference voltage generating circuit, to charge and discharge the DAC capacitor array by the second positive reference voltage and the second negative reference voltage, and control the plurality of groups of the sampling switching units to be connected to the first voltage output terminal and the second voltage output terminal of the reference voltage generating circuit when a voltage of the DAC capacitor array rises to a preset voltage, to continue to charge and discharge the DAC capacitor array through the first positive reference voltage and the first negative reference voltage until the voltage of the DAC capacitor array rises to a target voltage.

11. The analog-to-digital converter of claim 10, wherein a ratio of the target voltage to the preset voltage is 100:95.

12. The analog-to-digital converter of claim 11, wherein a time duration for the voltage of the DAC capacitor array to rise to the preset voltage is greater than or equal to 500 ps and less than or equal to 2 ns.

13. The analog-to-digital converter of claim 10, wherein the reference voltage generating circuit comprises a voltage level output circuit, a first driving current source, a second driving current source, a first switching circuit, a second switching circuit, a first decoupling capacitor, a second decoupling capacitor, a first resistor, and a second resistor;
a controlled terminal of the first switching circuit and a controlled terminal of the second switching circuit are both connected with a signal output terminal of the voltage level output circuit, a current output terminal of the first driving current source is connected with an input terminal of the first switching circuit, an output terminal of the first switching circuit, a first terminal of the first resistor and a first terminal of the first decoupling capacitor are interconnected to form a connection node which is the first voltage output terminal of the reference voltage generating circuit, a second terminal of the first resistor and a second terminal of the first decoupling capacitor are both grounded to form a connection node which is the second voltage output terminal of the reference voltage generating circuit, a current output terminal of the second driving current source is connected to an input terminal of the second switching circuit, an output terminal of the second switching circuit, a first terminal of the second resistor and a first terminal of the second decoupling capacitor are interconnected to form a connection node which is the third voltage output terminal of the reference voltage generating circuit, a second terminal of the second resistor and a second terminal of the second decoupling capacitor are both grounded to form a connection node which is a fourth voltage output terminal of the reference voltage generating circuit.

14. The analog-to-digital converter of claim 13, wherein the voltage level output circuit comprises a first voltage source, a third current source, a comparator, a third switching circuit, a third resistor, a fourth resistor, and a first capacitor;

a power output terminal of the first voltage source, a first terminal of the first capacitor, a first terminal of the third resistor and a non-inverting input terminal of the comparator are interconnected, a second terminal of the first capacitor and a second terminal of the third resistor are both grounded, a current output terminal of the third current source is connected with an input terminal of the third switching circuit, an output terminal of the third switching circuit, an inverting input terminal of the comparator and a first terminal of the fourth resistor are interconnected, a second terminal of the fourth resistor is grounded, an output terminal of the comparator is connected with a controlled terminal of the third switching circuit to form a connection node which is a signal output terminal of the voltage level output circuit.

15. The analog-to-digital converter of claim 14, wherein the first switching circuit, the second switching circuit and the third switching circuit are NMOS transistors.

16. The analog-to-digital converter of claim 15, wherein the reference voltage generating circuit further comprises a fifth resistor and a sixth resistor;

a first terminal of the fifth resistor and a first terminal of the sixth resistor are both connected to the signal output terminal of the voltage level output circuit, a second terminal of the fifth resistor is connected to the controlled terminal of the first switching circuit, and a second terminal of the sixth resistor is connected to the controlled terminal of the second switching circuit.

17. The analog-to-digital converter of claim 16, wherein each group of the sampling switching units is correspondingly connected with capacitors in the DAC capacitor array, each group of the sampling switching units comprises four sampling switching units, and each group of the sampling switching units is respectively connected with the first voltage output terminal, the second voltage output terminal, the third voltage output terminal and the fourth voltage output terminal of the reference voltage generating circuit.

18. The analog-to-digital converter of claim 13, wherein the second terminal of the first resistor is connected to a first ground wire and the second terminal of the second resistor is connected to a second ground wire.

* * * * *